United States Patent
So (10) Patent No.: US 8,946,689 B2
(45) Date of Patent: Feb. 3, 2015

(54) MICROCAVITY OLEDS FOR LIGHTING

(75) Inventor: Franky So, Gainesville, FL (US)

(73) Assignee: University of Florida Research Foundation, Inc., Gainesville, FL (US)

( * ) Notice: Subject to any disclaimer, the term of this patent is extended or adjusted under 35 U.S.C. 154(b) by 0 days.

(21) Appl. No.: 13/575,347

(22) PCT Filed: Feb. 22, 2011

(86) PCT No.: PCT/US2011/025667
§ 371 (c)(1),
(2), (4) Date: Jul. 26, 2012

(87) PCT Pub. No.: WO2011/106306
PCT Pub. Date: Sep. 1, 2011

(65) Prior Publication Data
US 2012/0305902 A1   Dec. 6, 2012

Related U.S. Application Data (60) Provisional application No. 61/307,191, filed on Feb. 23, 2010.

(51) Int. Cl.
*H01L 33/00* (2010.01)
*H01L 51/52* (2006.01)
(Continued)

(52) U.S. Cl.
CPC ........ *H01L 51/5271* (2013.01); *H01L 51/0059* (2013.01); *H01L 51/5265* (2013.01);
(Continued)

(58) Field of Classification Search
USPC ...................................... 257/40, 98, 99, 100
See application file for complete search history.

(56) References Cited

U.S. PATENT DOCUMENTS 8,632,894 B2 * 1/2014 Uehara .......................... 428/699
2002/0182839 A1 * 12/2002 Ogawa et al. ................. 438/604
(Continued)

FOREIGN PATENT DOCUMENTS

EP         0734078          9/1996
JP         2006100138 A     4/2006
(Continued)

OTHER PUBLICATIONS

Written Opinion and Search Report for related Singapore Patent Application No. 201205949-9 mailed Sep. 17, 2013.
(Continued)

*Primary Examiner* — Tan N Tran
(74) *Attorney, Agent, or Firm* — Wolf, Greenfield & Sacks, P.C.

(57) ABSTRACT

Various methods and systems are provided for related to organic light emitting diodes (OLEDs) having a microcavity In one embodiment, a white-light source includes a first microcavity organic light emitting diode (OLED) configured to emit a narrow spectrum of blue light, a second microcavity OLED configured to emit a narrow spectrum of green light, and a third microcavity OLED configured to emit a narrow spectrum of red light In another embodiment, a light source includes a plurality of OLEDs disposed on a glass substrate Each of the OLEDs is configured to emit light in substantially orthogonal to the glass substrate in a predefined spectrum Each of the OLEDs includes a semi-reflecting mirror, and an emitting layer, where the emitting layer in each OLED corresponds to a respective color of light emitted by the OLED.

20 Claims, 7 Drawing Sheets

(51) Int. Cl.
　　 *H01L 51/00*　　(2006.01)
　　 *H01L 27/32*　　(2006.01)

(52) U.S. Cl.
　　 CPC ......... *H01L27/3211* (2013.01); *H01L 51/0037* (2013.01); *H01L 51/0085* (2013.01); *H01L 2251/5361* (2013.01)
　　 USPC .................. 257/40; 257/98; 257/99; 257/100

(56) References Cited

U.S. PATENT DOCUMENTS

| | | | |
|---|---|---|---|
| 2003/0175553 A1* | 9/2003 | Thompson et al. | 428/690 |
| 2006/0220008 A1 | 10/2006 | Ko | |
| 2007/0075634 A1 | 4/2007 | Lee et al. | |
| 2007/0286944 A1* | 12/2007 | Yokoyama et al. | 427/66 |
| 2008/0138013 A1* | 6/2008 | Parriaux | 385/37 |
| 2008/0186702 A1* | 8/2008 | Camras et al. | 362/231 |

FOREIGN PATENT DOCUMENTS

| | | |
|---|---|---|
| JP | 2008091037 A | 4/2008 |
| WO | 2007141702 A1 | 12/2007 |

OTHER PUBLICATIONS

Hyoung Kun Kim et al., "Deep blue, efficient, moderate microcavity organic light-emitting diodes ", Organic Electronics 11, 137-145. (Jan. 2010) Abstract only.

International Search Report and Written Opinion dated Oct. 26, 2011.

English Translation for JP2006100138.

English Translation for JP2008091037.

* cited by examiner

MICROCAVITY OLEDS FOR LIGHTING

CROSS-REFERENCE TO RELATED APPLICATION

This application is the 35 U.S.C. §371 national stage of PCT application PCT/US2011/025667, filed Feb. 22, 2011, which claims priority to and the benefit of U.S. Provisional Application No. 61/307,191, filing date Feb. 23, 2010, which is hereby incorporated by reference in its entirety.

BACKGROUND

A broadband light source can be used to provide good quality lighting having a lighting spectrum that resembles natural sunlight. Light sources that do not provide light over the entire visible light spectrum can make the color of an object appear dull or even make the object appear to be a different color. For example, commercial fluorescent lights, which emit a limited amount of red light, can make an object appear to be dull red or even brown.

BRIEF DESCRIPTION OF THE DRAWINGS

Many aspects of the present disclosure can be better understood with reference to the following drawings. The components in the drawings are not necessarily to scale, emphasis instead being placed upon clearly illustrating the principles of the present disclosure. Moreover, in the drawings, like reference numerals designate corresponding parts throughout the several views.

DETAILED DESCRIPTION

Disclosed herein are various embodiments of a light source including one or more organic light emitting diodes (OLEDs) having a microcavity and methods of fabricating the same. Reference will now be made in detail to the description of the embodiments as illustrated in the drawings, wherein like reference numbers indicate like parts throughout the several views.

A microcavity OLED emits light substantially orthogonal to the OLED substrate. The microcavity of the OLED allows the OLED to be highly efficient and produce intense light because light emitted by the OLED is directed out of the OLED instead of allowing the emitted light to be retained within the OLED. Additionally, the present application describes a white light source including a plurality of microcavity OLEDs. In some embodiments, the white light source includes a microcavity OLED that emits intense red light in a narrow spectrum, microcavity OLED that emits intense green light in a narrow spectrum, and a microcavity OLED that emits intense blue light in a narrow spectrum. Since each microcavity OLED intensely emits the specific colors in a narrow spectrum, when the white light source illuminates an object, the visible colors reflected by the object may be vibrant and warm due to the intensity and the selection of bands of light emitted by the white light source.

A variety of light sources are available including luminaires using incandescent and/or fluorescent light bulbs. Luminaires are sometimes used in commercial, industrial, or office settings, and are often in the form of a light panel. Luminaires may lose 40-50% of the light they emit due to poor light extraction. Also, even if a light source such as a state of the art LED has a luminous efficacy of 100 lm/W (lumens per Watt), the efficacy of a luminaire may be as low as 40 lm/W.

The broader the band of light that a light source emits, the more the light emitted by the light source resembles sunlight. A figure of merit used in lighting is color rendering index (CRI). CRI is a quantitative measure of the ability of a light source to reproduce the colors of various objects in comparison with a natural light source, such as the sun. A broadband light source covering the entire visible spectrum has a CRI larger than 90. In contrast, a commercial fluorescent light tube, which emits a small amount of red light, has a CRI as low as 50. Because of this lack of red light, a red object appears to be dull red or even brown when illuminated by a commercial fluorescent light tube. White-emitting OLEDs are useful for lighting because organic materials have wide emission spectra. Combining red, green and blue emitters in a single OLED panel yields an OLED that has a CRI higher than 80 depending on the emission spectrum.

Figure 1:
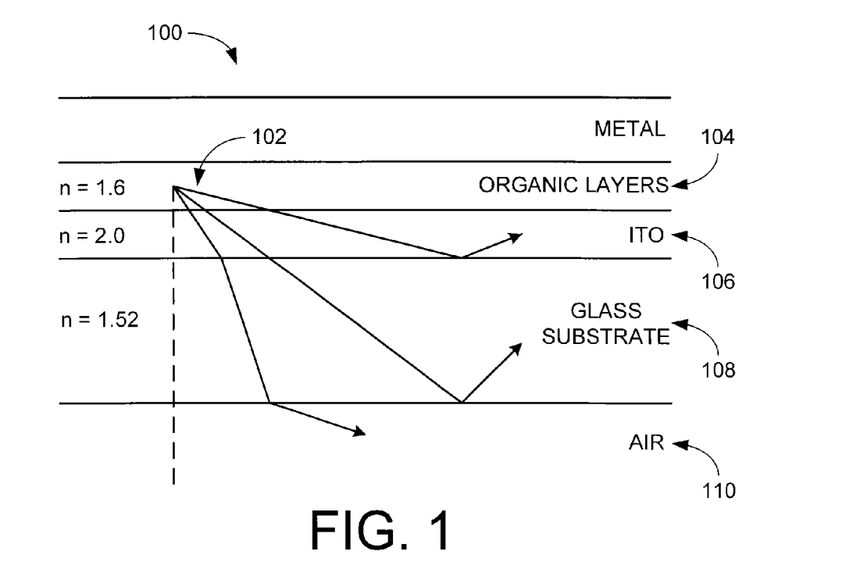
FIG. 1 is a graphical representation illustrating a non-limiting example of the transmission of emitted light through a plurality of layers of a white-emitting OLED in accordance with various embodiments of the present disclosure.

Some efficient white-emitting OLEDs have efficacies up to 100 km/VV. However, that requires exotic light extraction methods which are not practical for manufacturing. FIG. 1 is a diagram of a non-limiting example of the transmission of emitted light 102 through a plurality of layers of a white-emitting OLED 100. As can be seen in FIG. 1, because light emitted from the white-emitting OLED 100 is trapped due to refraction and reflection in an organic layer 104, an Indium Tin Oxide (ITO) layer 106, and/or a glass substrate 108, only a small fraction of the emitted light 102 is extracted into air 110. Examples of the indices of refraction (n) for the organic layers 104, the ITO layer 106, and the glass substrate 108 are also illustrated.

Figure 2:
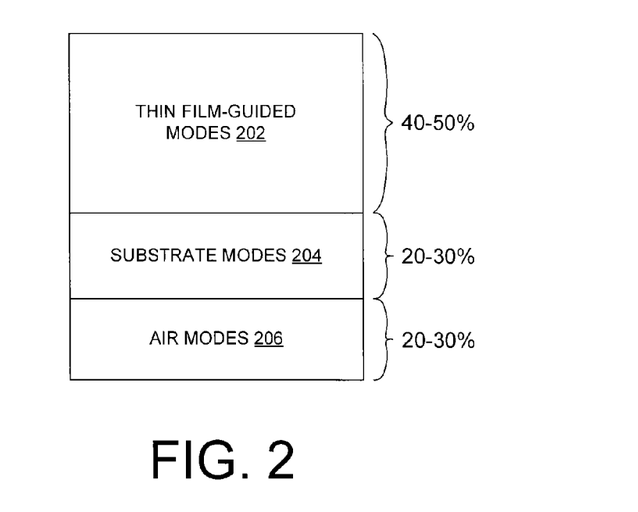
FIG. 2 is a graphical representation illustrating of the various modes of the plurality of layers of the white-emitting OLED of FIG. 1 in accordance with various embodiments of the present disclosure.

FIG. 2 is a diagram of the various modes of the plurality of layers of the white-emitting OLED 100. As can be seen in FIG. 2, thin film guided modes 202 (i.e., modes of the organic layer 104 and/or the ITO layer 106 of FIG. 1) trap about 40-50% of the emitted light 102, substrate modes 204 (i.e., modes of the glass substrate 108 of FIG. 1) trap about 20-30% of the emitted light 102, and only about 20-30% of the emitted light 102 reach the air modes 206. While a glass substrate mode 204 may be eliminated using lens arrays or photonic crystals, a thin-film guided mode 202 is very difficult to eliminate because the organic/ITO layers 104/106 are inside the OLED 100 and are not accessible to the outside.

Figure 3:
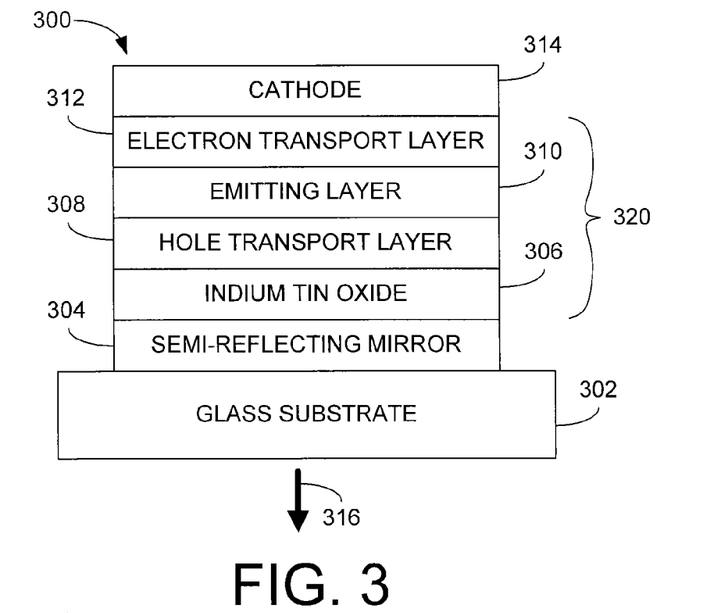
FIGS. 3 and 4 are graphical representations of examples of microcavity organic light emitting diodes (OLEDs) in accordance with various embodiments of the present disclosure.

FIG. 3 is a diagram of a non-limiting embodiment of a microcavity OLED 300. The microcavity OLED 300 includes a glass substrate 302 and a semi-reflecting mirror 304 formed on the glass substrate 302. In some embodiments, the semi-reflecting mirror 304 is a thin silver layer (e.g., about 10-20 nm thick), and in other embodiments the semi-reflecting mirror 304 is a quarter wave stack including stacks of silicon dioxide ($SiO_2$) and titanium dioxide ($TiO_2$), which will be discussed in further detail below. Further, an ITO layer 306 is formed on the semi-reflecting mirror 304. In some embodiments, the ITO layer 306 is about 100 nm thick.

A hole transport layer 308 is formed on the ITO layer 306. In some embodiments, the hole transport layer 308 includes a 1,1-bis[(di-4-tolylamino) phenyl]cyclohexane (TAPC) layer, which may be about 50 nm thick. An emitting layer 310 is formed on the hole transport layer 308. The material included in the emitting layer 310 determines the color (or the spectral frequencies) of the light emitted by the microcavity OLED 300. For example, for a microcavity OLED 300 that emits red light in the range of, e.g., about 585 nm to about 675 nm, the emitting layer 310 may include 3,5'-N,N'-dicarbazole-benzene ("mCP") doped with tris(1phenylisoquinoline)iridium ("Ir (piq) $_3$". Similarly, for a microcavity OLED 300 that emits green light in the range of, e.g., about 525 nm to about 655 nm, the emitting layer 310 may include mCP doped with fac-tris(2-phenylpyridinato)iridium(III) ("Ir(ppy)$_3$"). Likewise, for a microcavity OLED 300 that emits blue light in the range of, e.g., about 435 nm to about 540 nm, the emitting layer 310 may include 3,5'-N,N'-dicarbazole-benzene (mCP):Iridium(III)bis[(4,6-di-flourophenyl)-pyridinato-N,C2'] picolinate ("Flrpic").

An electron transport layer 312 is formed on the emitting layer 310. The electron transport layer 312 may include 2,9-dimethly-4,7-diphenyl-1,10-phenanthroline (BCP) layer and/or a tris[3-(3-pyridyl)-mesityl]borane ("3TPYMB") layer. Further, a cathode 314 is formed on the electron transport layer 312. The cathode 314 includes a metal layer. For example, the cathode 314 may include cesium carbonate ($CsCO_3$) (about 1 nm thick) and aluminum (Al) (about 100 nm thick) or lithium fluoride (LiF) (about 1 nm thick) and Al (about 100 nm thick).

Figure 4:
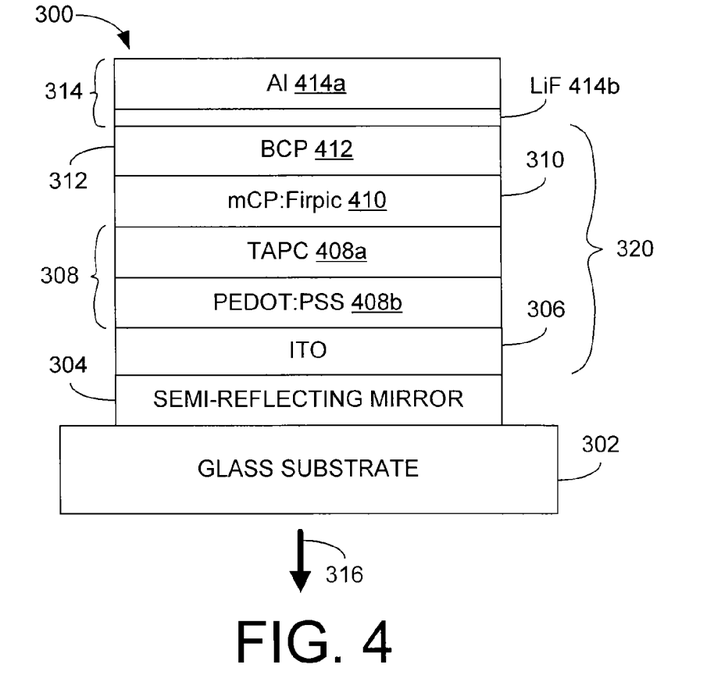

FIG. 4 is a diagram of another non-limiting embodiment of a microcavity OLED 300 that emits blue light. In the embodiment illustrated in FIG. 4, the cathode 314 includes an aluminum (Al) layer 414a, which is about 100 nm thick, and a LiF layer 414b that is about 1 nm thick. The LiF layer 414b is deposited on an electron transport layer 312 including a BCP layer 412 that is about 40 nm thick. The BCP layer 412 is deposited on an emitting layer 310 including an mCP: Firpic layer 410 that is about 20 nm thick. Additionally, the emitting layer 310 is deposited on a hole transport layer 308 including a TAPC layer 408a, which is about 50 nm thick. Furthermore, the emitting layer 310 includes a polv(3,4-ethylenedioxythioohene) poly(styrenesulfonate) ("PEDOT:PSS") layer 408b that is about 25 nm thick and which is formed on an ITO layer 306 that is about 50 nm thick.

Figure 5:
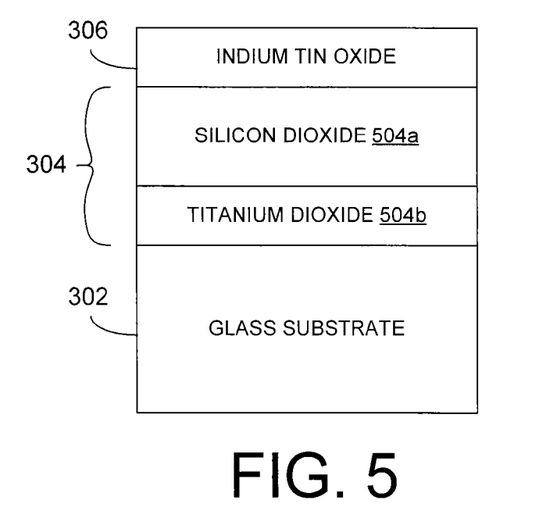
FIGS. 5 and 6 are graphical representations of examples of semi-reflecting mirrors of the microcavity OLEDs of FIGS. 3 and 4 in accordance with various embodiments of the present disclosure.

FIG. 5 is a diagram of a non-limiting example of a semi-reflecting mirror 304 of the embodiment of a microcavity OLED 300 illustrated in FIGS. 3 and 4. The illustrated example of the semi-reflecting mirror 304 is a quarter wave stack that includes a silicon dioxide ($SiO_2$) layer 504a, which is formed on a titanium dioxide ($TiO_2$) layer 504b. The thicknesses of the $SiO_2$ layer 504a and the $TiO_2$ layer 504b each correspond to a quarter wavelength of light. Accordingly, the thickness of the layers 504a and 504b of the semi-reflecting mirror 304 depend upon the wavelength of light emitted by the microcavity OLED 300. In one implementation, the silicon dioxide layer 504a is about 79 nm thick and the titanium dioxide layer 504b is about 48 nm thick. The semi-reflecting mirror 304 is formed on the glass substrate 302, which may be about 1 mm thick. In some embodiments, the semi-reflecting mirror 304 has a width of about one inch. In some embodiments, the area of the semi-reflecting mirror 304 is about one inch by about one inch. Also, in some embodiments, the semi-reflecting mirror 304 has a reflectance (R) that is substantially equal to 0.39 at 475 nm. The reflectivity of the semi-reflecting mirror 304 may vary between about 40% and about 70%, and the reflection spectrum is broad.

Figure 6:
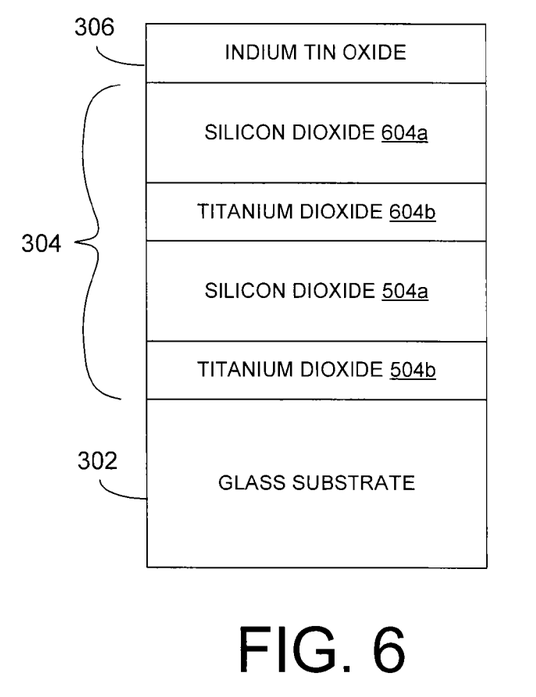

FIG. 6 is a diagram of another non-limiting example of a semi-reflecting mirror 304 of the embodiment of a microcavity OLED 300 illustrated in FIGS. 3 and 4. The example of the semi-reflecting mirror 304 illustrated in FIG. 6 is similar to the example of the semi-reflecting mirror 304 illustrated in FIG. 5 except that the semi-reflecting mirror 304 illustrated in FIG. 6 includes two sets of silicon dioxide and titanium dioxide layers (504a/504b and 604a/604b) instead of one set (504a/504b) as illustrated in FIG. 5. In one implementation, the silicon dioxide layers 504a and 604a are about 79 nm thick and the titanium dioxide layer 504b and 604b are about 48 nm thick. In other implementations, the silicon dioxide layers 504a and 604a and/or the titanium dioxide layer 504b and 604b may have different thicknesses. Further, in other embodiments, the semi-reflecting mirror 304 may include three or more sets of silicon dioxide and titanium dioxide layers. In some embodiments, such as the one illustrated in FIG. 6, the semi-reflecting mirror 304 has an R that is substantially equal to 0.70 at 475 nm. Each of the semi-reflecting mirrors 304 illustrated in FIGS. 5 and 6 include alternating layers of a material having a low refractive index (e.g., $SiO_2$) with a material having a high refractive index (e.g., $TiO_2$).

Referring back to FIG. 3, the operation of the microcavity OLED 300 will now be described. The cathode 314 of the microcavity OLED 300 acts as a reflecting mirror and the semi-reflecting mirror 304 acts as a half mirror, thus forming a microcavity 320 between the cathode 314 and the semi-reflecting mirror 304. The microcavity 320 has the properties of both low transmissivity and high reflectivity. In other words, the semi-reflecting mirror 304 is a partially transmissive and partially transparent layer. As photons are generated inside the microcavity 320, they are reflected by the mirrors from both sides of the microcavity 320 and transmitted out of the half mirror provided by the semi-reflecting mirror 304. Consequentially, the light 316 that is transmitted from the semi-reflecting mirror 304 through the glass substrate 302 is transmitted in a direction that is substantially orthogonal to the glass substrate 302 instead of in all directions. Because the microcavity 320 orients the emitted light in a particular direction, a considerable amount of the light that is emitted by the microcavity OLED 300 is also transmitted out of the microcavity OLED 300 and not retained within the microcavity OLED 300.

Because of the microcavity effects discussed above, a microcavity OLED 320 has very different emission characteristics from OLEDs that lack a microcavity 320. An OLED that lacks a microcavity 320 is a Lambertian light source that emits light in all directions. A Lambertian light source is undesirable for lighting because a large amount of the emitted light is wasted (e.g., not directly illuminating the object or area to be illuminated). On the other hand, a microcavity OLED 300 is a directional emitter depending on the reflecting properties of the microcavity 320. As a result, a microcavity OLED 300 can have efficiencies about three to four times the efficiencies of OLEDs that lack a microcavity 320.

Figure 7:
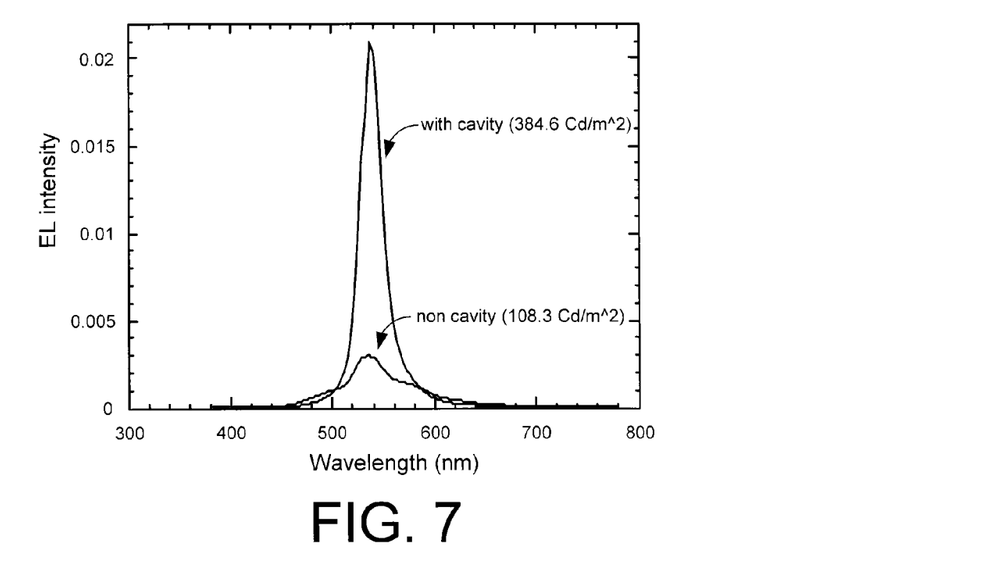
FIGS. 7 and 8 are graphical representations illustrating non-limiting examples of the light intensity of a microcavity OLED of FIGS. 3 and 4 and an OLED that lacks a microcavity in accordance with various embodiments of the present disclosure.

FIG. 7 is a graph of the emission spectra of an embodiment of the microcativity OLED 300 illustrated in FIG. 3 and an embodiment of an OLED that lacks a microcavity 320. Specifically, FIG. 7 is a graph of EL intensity versus wavelength for a microcavity OLED 320 versus a green-emitting OLED that lacks a microcavity 320. The luminance of the microcavity OLED 320 is about 385 nits versus the luminance of the green-emitting OLED, which is about 108 nits, as can be seen in FIG. 7.

Figure 8:
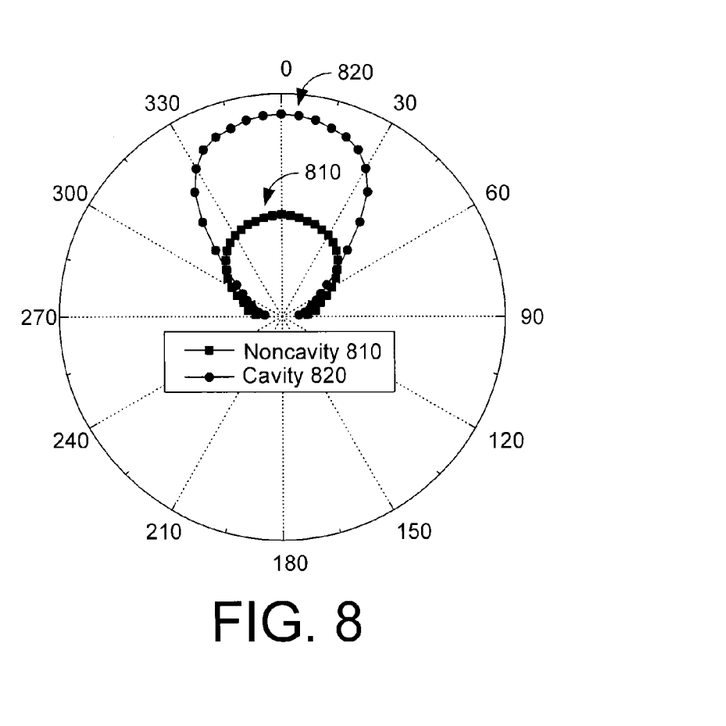

FIG. 8 is a polar plot of the intensity of light versus the angle of the light for the embodiment of the microcativity OLED 300 of FIG. 7 versus an OLED that lacks a microcavity 320. As can be seen in FIG. 8, the OLED that lacks a microcavity 320 (marked "noncavity" 810) has a lower intensity than the microcavity OLED 300 (marked "cavity" 820), and the light is emitted from the light source at an angle primarily between −30 degrees and +30 degrees. Considering FIGS. 7 and 8 together, it can be seen that for a microcavity OLED 300 both the spectrum of light emitted and the angle of emission are narrow.

Figure 9:
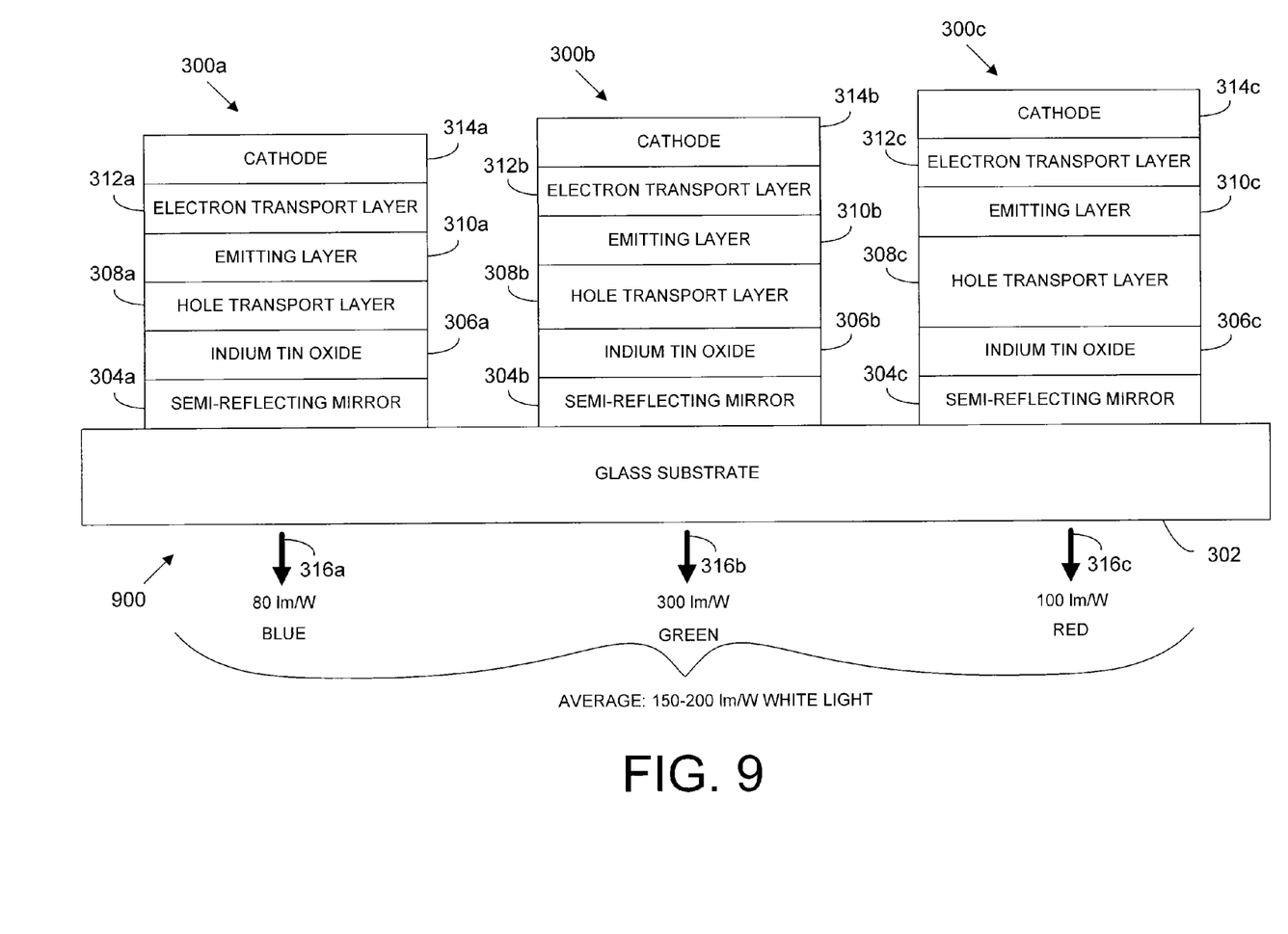
FIG. 9 is a graphical representation of an example of a white-light emitting light source including a plurality of microcavity OLEDs of FIGS. 3 and 4 in accordance with various embodiments of the present disclosure.

FIG. 9 is a diagram of a non-limiting embodiment of a white-light emitting light source 900 including a plurality of microcavity OLEDs 300a, 300b, 300c. The microcavity OLEDs 300a, 300b, 300c are phosphorescent OLEDs, which can be very efficient. For example, the luminous efficiency of a green light emitting, microcavity OLED 300b can be as high as 300 lm/W whereas a green light emitting OLED without a microcavity may have a luminous efficiency of only 100 lm/VV. Further, the efficiency of a blue light emitting, microcavity OLED 300a and red light emitting, microcavity OLED 300c may each be over 60 lm/W. Accordingly, the white-emitting light source 900 including the plurality of microcavity OLEDs 300a, 300b, 300c may achieve an overall efficiency of about 150-200 lm/W. This efficiency may be three to four times greater than the efficiency of LEDs used in luminaries.

Figure 10:
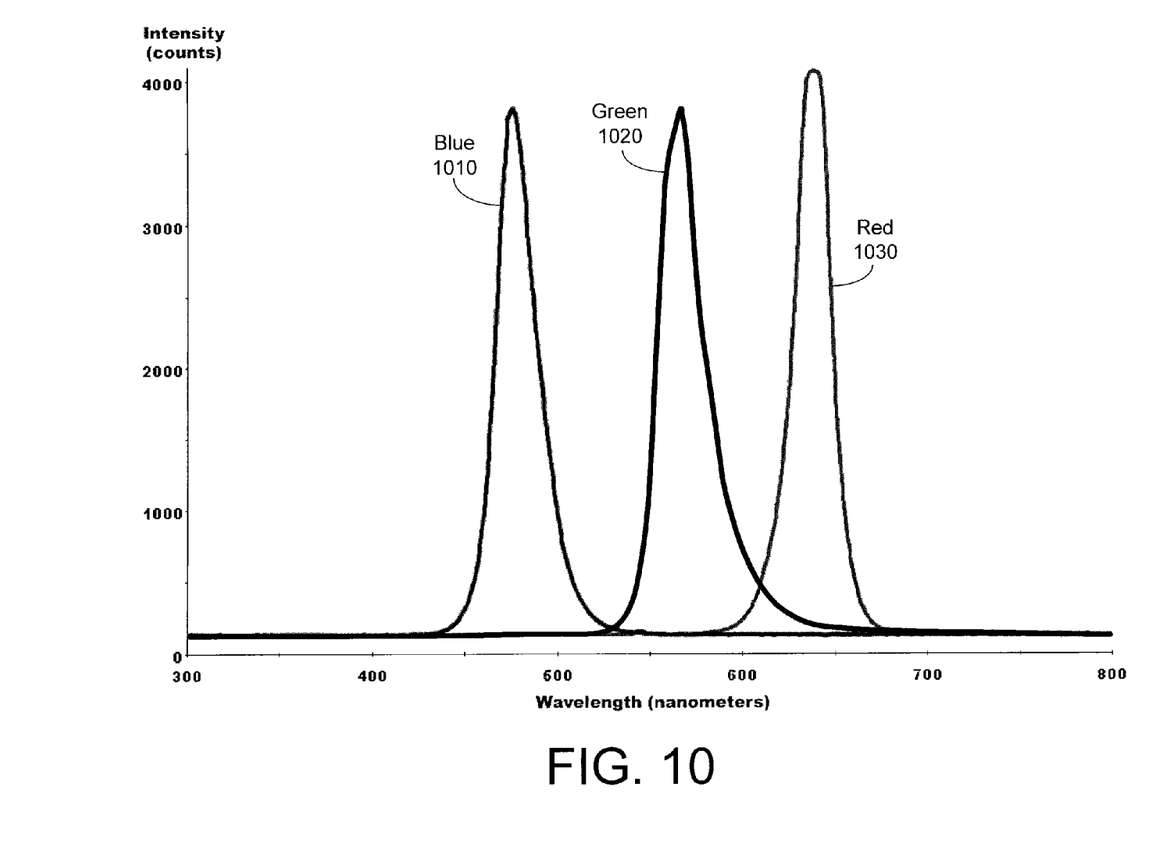
FIG. 10 is a graphical representation illustrating a non-limiting example of the light intensity of the white-light emitting light source of FIG. 9 in accordance with various embodiments of the present disclosure.

White light generated from the red, green, and blue microcavity OLEDs 300a, 300b, 300c has an emission spectrum similar to the spectrum shown in FIG. 10. As can be seen in FIG. 10, the blue light 316a (FIG. 9) may include an intensity 1010 corresponding to a wavelength substantially within a range of about 435 nm to about 540 nm, the green light 316b (FIG. 9) may include an intensity 1020 corresponding to a wavelength substantially within a range of about 525 nm to about 655 nm, and the red light 316c (FIG. 9) may include an intensity 1030 corresponding to a wavelength substantially within a range of about 585 nm to about 675 nm. Similarly, as can also be seen in FIG. 10, the blue light may include a peak intensity corresponding to a wavelength substantially within a range of about 450 nm to about 480 nm, the green light may include a peak intensity corresponding to a wavelength substantially within a range of about 530 nm to about 575 nm, and the red light may include a peak intensity corresponding to a wavelength substantially within a range of about 620 nm to about 650 nm. Accordingly, white light emitted by the white-light emitting light source 900 does not include the same intensity for all wavelengths, but rather the emission spectrum includes a narrow spectrum including a peak intensity for certain colors. When the light source 900 illuminates objects, the color that reflects off the objects appears to be saturated because the three narrow emission bands of the light emitted by microcavity OLEDs 300a, 300b, 300c peak at saturated RGB colors. When an embodiment of the white-light emitting light source 900 illuminates an object, the colors of the object appear warmer, more vibrant, and less dull as a result of the predefined bands of light emitted by the white-light emitting light source 900 and reflected off the object. For example, an object that is red appears to have more of a fire engine red color when illuminated by a white-light emitting light source 900 than a brick red or claret color that appears when the object is illuminated by an incandescent light source. Additionally, no external luminaries are needed since the light emitted by a white-light emitting light source 900 is highly directional.

Figure 11:
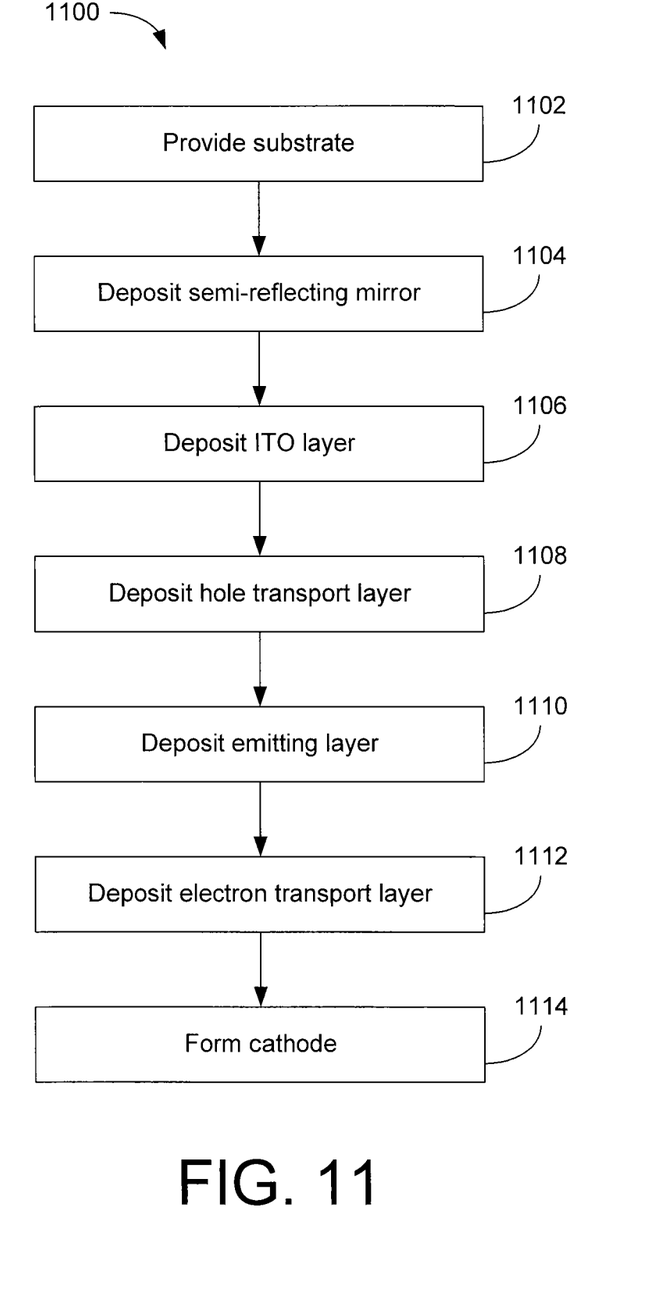
FIG. 11 is a flow chart illustrating the fabrication of microcavity OLEDs of FIGS. 3 and 4 in accordance with various embodiments of the present disclosure.

Referring next to FIG. 11, shown is a flow chart 1100 illustrating an example of a method of fabricating a microcavity OLED 300 (FIG. 3). Beginning with block 1102, a glass substrate 302 (FIG. 3) is provided. In block 1104, a semi-reflecting mirror 304 (FIG. 3) is deposited on the glass substrate 302. In the case of a semi-reflecting mirror 304 including a stack of $SiO_2$ and $TiO_2$ layers (FIGS. 5 and 6), each layer of $SiO_2$ and $TiO_2$ may be deposited by sputtering. In the case of the semi-reflecting mirror 304 including a thin layer of silver, the silver can be deposited by vacuum evaporation. In some embodiments, the layer of silver is about 10-20 nm thick.

Next, in block 1106, an ITO layer 306 (FIG. 3) is deposited by sputtering. In some embodiments, the ITO layer 306 is about 100 nm thick. A hole transport layer 308 (FIG. 3) is then deposited in block 1108. Vacuum evaporation may be used to deposit the hole transport layer 308 on the ITO layer 306. Subsequently, an emitting layer 310 (FIG. 3) is then deposited in block 1110 on the hole transport layer 308. Vacuum evaporation may be used to deposit the emitting layer 310. Further, an electron transport layer 312 (FIG. 3) is deposited on the emitting layer 310 in block 1112. Vacuum evaporation may be used to deposit the electron transport layer 312. After the emitting layer 310 is deposited, a cathode 314 (FIG. 3) is formed in block 1114. In some implementations, the cathode 314 may be formed by depositing a layer of cesium carbonate ($CsCO_3$) (about 1 nm thick), aluminum (about 100 nm thick), and/or lithium fluoride (LiF) (about 1 nm thick) on the electron transport layer 312.

Referring to FIG. 9, a method of fabricating a white-light emitting light source 900 includes fabricating a plurality of microcavity OLEDs 300a, 300b, 300c. The plurality of microcavity OLEDs 300a, 300b, 300c may be fabricated on a common substrate 302 as illustrated in FIG. 9. Additionally, the method includes the steps described above with respect to fabricating microcavity OLED 300, except that three different emitting layers 310a, 310b, and 310c corresponding to blue, green, and red light are deposited for each microcavity OLEDs 300a, 300b, 300c. For example, the common substrate 302 may be provided in block 1102. Each of the plurality of microcavity OLEDs 300a, 300b, 300c may then be fabricated as described with respect to blocks 1104 through 1114. The plurality of microcavity OLEDs 300a, 300b, 300c may be concurrently or consecutively fabricated on the common substrate 302. While FIG. 9 depicts three microcavity OLEDs 300a, 300b, 300c, other embodiments of white-light emitting light sources 900 can include other multiples, combinations and/or configurations of microcavity OLEDs.

It should be emphasized that the above-described embodiments of the present disclosure are merely possible examples of implementations set forth for a clear understanding of the principles of the disclosure. Many variations and modifications may be made to the above-described embodiment(s) without departing substantially from the spirit and principles of the disclosure. All such modifications and variations are intended to be included herein within the scope of this disclosure and protected by the following claims.

It should be noted that ratios, concentrations, amounts, and other numerical data may be expressed herein in a range format. It is to be understood that such a range format is used for convenience and brevity, and thus, should be interpreted in a flexible manner to include not only the numerical values explicitly recited as the limits of the range, but also to include all the individual numerical values or sub-ranges encompassed within that range as if each numerical value and sub-range is explicitly recited. To illustrate, a concentration range of "about 0.1% to about 5%" should be interpreted to include not only the explicitly recited concentration of about 0.1 wt % to about 5 wt %, but also include individual concentrations (e.g., 1%, 2%, 3%, and 4%) and the sub-ranges (e.g., 0.5%, 1.1%, 2.2%, 3.3%, and 4.4%) within the indicated range. The term "about" can include traditional rounding according to significant figures of numerical values. In addition, the phrase "about 'x' to 'y'" includes "about 'x' to about 'y'".

Therefore, at least the following is claimed:

1. A white-light source, comprising:
   a first microcavity organic light emitting diode (OLED) configured to emit a narrow spectrum of blue light;
   a second microcavity OLED configured to emit a narrow spectrum of green light; and
   a third microcavity OLED configured to emit a narrow spectrum of red light,
   wherein the blue light emitted by the first OLED, green light emitted by the second OLED, and red light emitted by the third OLED combine to produce white illuminating light with a color rendering index that is greater than 80,
   wherein each of the microcavity OLEDs comprises:
      an electron transport layer formed between a cathode and a first side of an emitting layer; and
      a hole transport layer formed between a second side of the emitting layer and an indium tin oxide (ITO) layer,
   wherein the hole transport layer comprises a 1,1-bis[(di-4-tolylamino)phenyl]cyclohexane (TAPC) layer adjacent to the emitting layer and a poly(3,4-ethylenedioxythiophene) poly(styrenesulfonate) (PEDOT:PSS) layer adjacent to the ITO layer.

2. The white-light source of claim 1, wherein the blue light includes an intensity corresponding to a wavelength substantially within a range of about 435 nm to about 540 nm, the green light includes an intensity corresponding to a wavelength substantially within a range of about 525 nm to about 655 nm, and the red light includes an intensity corresponding to a wavelength substantially within a range of about 585 nm to about 675 nm.

3. The white-light source of claim 2, wherein the blue light includes a peak intensity corresponding to a wavelength substantially within a range of about 450 nm to about 480 nm, the green light includes a peak intensity corresponding to a wavelength substantially within a range of about 530 nm to about 575 nm, and the red light includes a peak intensity corresponding to a wavelength substantially within a range of about 620 nm to about 650 nm.

4. The white-light source of claim 1, wherein the first microcavity OLED, the second microcavity OLED, and the third microcavity OLED are each disposed on a common substrate.

5. The white-light source of claim 4, wherein the red light, green light, and blue light are emitted substantially orthogonal to the common substrate.

6. The white-light source of claim 1, wherein the ITO layer of each microcavity OLED is disposed on a semi-reflecting mirror.

7. The white-light source of claim 6, wherein the semi-reflecting mirror includes a quarter wave stack.

8. The white-light source of claim 6, wherein the semi-reflecting mirror includes a layer having a low refractive index formed on a layer having a high refractive index.

9. The white-light source of claim 6, wherein the semi-reflecting mirror includes a plurality of silicon dioxide layers alternating with a plurality of titanium dioxide layers.

10. The white-light source of claim 6, wherein the semi-reflecting mirror includes a silver film.

11. The white-light source of claim 1, wherein the electron transport layer includes a 2,9-dimethyl-4,7-diphenyl-1,10-phenanthroline ("BCP") layer or a tris[3-(3-pyridyl)-mesityl]borane ("3TPYMB") layer.

12. The white-light source of claim 1, wherein the cathode includes cesium carbonate ($CsCO_3$) and aluminum (Al).

13. The white-light source of claim 12, wherein the cathode comprises an Al layer and a $CsCO_3$ layer.

14. The white-light source of claim 1, wherein the white-light source producing the white illuminating light has an overall efficiency of 150 lm/W or more.

15. A white-light source, comprising:
   a first microcavity organic light emitting diode (OLED) configured to emit a narrow spectrum of blue light;
   a second microcavity OLED configured to emit a narrow spectrum of green light; and
   a third microcavity OLED configured to emit a narrow spectrum of red light,
   wherein the blue light emitted by the first OLED, green light emitted by the second OLED, and red light emitted by the third OLED combine to produce white illuminating light with a color rendering index that is greater than 80,
   wherein each of the microcavity OLEDs comprises:
      an electron transport layer formed between a cathode and a first side of an emitting layer; and
      a hole transport layer formed between a second side of the emitting layer and an indium tin oxide (ITO) layer,
   wherein the emitting layer of the first microcavity OLED includes 3,5'-N,N'-dicarbazolebenzene ("mCP"):Iridium(III)bis[(4,6-di-fluorophenyl)-pyridinato-N,C2'] picolinate ("FIrpic").

16. The white-light source of claim 15, wherein the blue light includes an intensity corresponding to a wavelength substantially within a range of about 435 nm to about 540 nm, the green light includes an intensity corresponding to a wavelength substantially within a range of about 525 nm to about 655 nm, and the red light includes an intensity corresponding to a wavelength substantially within a range of about 585 nm to about 675 nm.

17. The white-light source of claim 15, wherein the first microcavity OLED, the second microcavity OLED, and the third microcavity OLED are each disposed on a common substrate.

18. The white-light source of claim 15, wherein the hole transport layer comprises a 1,1-bis[(di-4-tolylamino)phenyl]cyclohexane ("TAPC") layer and/or the electron transport layer includes a 2,9-dimethyl-4,7-diphenyl-1,10-phenanthroline ("BCP") layer or a tris[3-(3-pyridyl)-mesityl]borane ("3TPYMB") layer.

19. A white-light source, comprising:
a first microcavity organic light emitting diode (OLED) configured to emit a narrow spectrum of blue light;
a second microcavity OLED configured to emit a narrow spectrum of green light; and
a third microcavity OLED configured to emit a narrow spectrum of red light,
wherein the blue light emitted by the first OLED, green light emitted by the second OLED, and red light emitted by the third OLED combine to produce white illuminating light with a color rendering index that is greater than 80,
wherein each of the microcavity OLEDs comprises:
an electron transport layer formed between a cathode and a first side of an emitting layer; and
a hole transport layer formed between a second side of the emitting layer and an indium tin oxide (ITO) layer,
wherein the emitting layer of the second microcavity OLED includes 3,5'-N,N'-dicarbazolebenzene ("mCP") doped with fac-tris(2-phenylpyridinato)iridium(III) ("Ir(ppy)$_3$").

20. A white-light source, comprising:
a first microcavity organic light emitting diode (OLED) configured to emit a narrow spectrum of blue light;
a second microcavity OLED configured to emit a narrow spectrum of green light; and
a third microcavity OLED configured to emit a narrow spectrum of red light,
wherein the blue light emitted by the first OLED, green light emitted by the second OLED, and red light emitted by the third OLED combine to produce white illuminating light with a color rendering index that is greater than 80,
wherein each of the microcavity OLEDs comprises:
an electron transport layer formed between a cathode and a first side of an emitting layer; and
a hole transport layer formed between a second side of the emitting layer and an indium tin oxide (ITO) layer,
wherein the emitting layer of the third microcavity OLED includes 3,5'-N,N'-dicarbazolebenzene ("mCP") doped with tris(1-phenylisoquinoline)iridium ("Ir(piq)$_3$").

* * * * *